United States Patent [19]

Gruber

[11] 4,024,297

[45] May 17, 1977

[54] ACTINIC LIGHT POLYMERIZABLE COATING COMPOSITIONS

[75] Inventor: Gerald W. Gruber, Sewickley, Pa.

[73] Assignee: PPG Industries, Inc., Pittsburgh, Pa.

[22] Filed: Feb. 2, 1976

[21] Appl. No.: 654,500

[52] U.S. Cl. .............................. 427/54; 96/115 P; 204/159.23; 252/426

[51] Int. Cl.$^2$ ......................................... B05D 3/06

[58] Field of Search ............... 427/54; 204/159.23; 252/426; 96/115 P

[56] References Cited

UNITED STATES PATENTS 3,924,023  12/1975  Boranian et al. .................... 427/54

OTHER PUBLICATIONS

Herkstroeter et al., J. Am. Chem. Soc. vol. 86, pp. 4537–4540.

*Primary Examiner*—John H. Newsome
*Attorney, Agent, or Firm*—George D. Morris; J. Timothy Keane

[57] ABSTRACT

An aromatic ketone photopolymerization activator is present in an actinic light curable composition containing organic polymerizable material containing a plurality of sites of ethylenic unsaturation. The composition is polymerized by exposing it to actinic light.

19 Claims, No Drawings

ACTINIC LIGHT POLYMERIZABLE COATING COMPOSITIONS

The use of actinic light polymerizable compositions is becoming more widespread. This growing interest is primarily occasioned by the low power requirements of actinic light sources as compared to thermal ovens, by the low levels of environmental pollution which can be obtained, and by the minimal space required for actinic light curing equipment. Nonetheless, several problems have arisen which have retarded the use of actinic light curable compositions in certain areas.

One problem is that the presence of a photopolymerization activator often imparts an unacceptable degree of instability to the compositions during storage prior to use.

Another problem is that during polymerization by exposure to actinic light, the photopolymerization activator or the reaction products of the photopolymerization activator often iparts an undesirable color to the polymerized composition.

In some end uses, as for example in the coating of food and beverage containers, it is frequently desirable to apply an actinic light polymerizable composition to one side of a substrate and cure it by exposure to actinic light. The other side of the substrate is then coated with a curable coating composition and polymerized by baking at elevated temperatures in an oven. Often the presence of the photopolymerization activator or its reaction products in the actinic light cured coating causes the exterior coating to discolor.

It has now been found that actinic light polymerizable compositions containing certain aromatic ketones as photopolymerization activators possess acceptable storage stability and show insignificant color development upon curing by exposure to actinic light. After polymerization by exposure to actinic light, the polymerized composition usually shows insignificant color development upon post baking at the temperatures customarily used to crosslink thermally cured organic compositions. The photopolymerization activators of the invention may be represented by the formula:

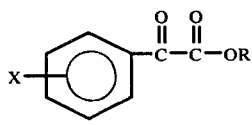

wherein
R is hydrogen, alkyl containing from one to about twenty-two carbon atoms, benzyl, phenyl, hydroxyalkyl containing from one to about ten carbon atoms, chloroalkyl containing from one to about ten carbon atoms, bromoalkyl containing from one to about ten carbon atoms, alkoxyalkyl where the alkoxy portion contains from one to about four carbon atoms and where the alkyl portion contains from one to about ten carbon atoms, or phenoxyalkyl where the alkyl portion contains from one to about ten carbon atoms;
X is hydrogen, halo, alkoxy containing from one to about four carbon atoms or alkyl containing from one to about four carbon atoms;
R is perferably alkyl containing from one to about twelve carbon atoms, benzyl or phenyl. Most preferably, R is alkyl containing from one to about four carbon atoms, alkoxyalkyl where the alkoxy portion contains from about one to about four carbon atoms and where the alkyl portion contains from one to about six carbon atoms or phenyl. X is preferably hydrogen or chloro. X is preferably located in the ortho position although the meta and para positions are satisfactory. Additional minor substituents which do not render the compound unsuitable for its intended purpose may be placed on the phenyl ring.

Examples of these photopolymerization activators are:
methyl phenylglyoxylate
ethyl phenylglyoxylate
butyl phenylglyoxylate
benzyl phenylglyoxylate
butoxyethyl phenylglyoxylate
phenoxyethyl phenylglyoxylate
dodecyl phenylglyoxylate
phenyl phenylglyoxylate
ethyl o-chlorophenylglyoxylate
phenylglyoxylic acid The preferred photopolymerization activators are methyl phenylglyoxylate, ethyl phenylglyoxylate, butyl phenylglyoxylate and butoxyethyl phenylglyoxylate. The esters of phenylglyoxylic acid may be prepared by reacting phenylglyoxyloyl chloride (Kharasch and Brown, *Journal of the Americal Chemical Society*, vol. 64, page 329 et seq. [1942]) with the appropriate alcohol.

The photopolymerization activators of the invention are useful in the photopolymerization of organic polymerizable material containing ethylenic unsaturation. The polymerization reaction may be used to form polymers, solutions of polymers, polymer emulsions, coatings, adhesives, and photoresists. A particularly preferred use is in the formation of hard, infusible thermoset coatings.

There are many types of organic polymerizable material which may be used in the practice of the invention. In general, these molecules contain one or more sites of ethylenic unsaturation and are capable of being free radically addition polymerized by interaction with the photopolymerization activator upon exposure to actinic light. The organic polymerizable material usually comprises molecules containing a plurality of such sites of ethylenic unsaturation. The sites of ethylenic unsaturation may lie along the backbone of the molecule or they may be present in side chains attached to the molecular backbone. As a further alternative, both of these configurations may be present concurrently. Most often, the organic polymerizable material comprises ethylenically unsaturated polyester containing a plurality of sites of ethylenic unsaturation, polymer having a plurality of sites of acrylic unsaturation, monomer having a plurality of sites of acrylic unsaturation or mixture thereof. The term "acrylic unsaturation" as used throughout the specification and claims, unless otherwise qualified, means unsaturation provided by unsubstituted acrylyl or α-substituted acrylyl groups. Examples of α-substituted acrylyl groups are methacrylyl, ethacrylyl and α-cloroacrylyl.

The ethylenically unsaturated polyesters constitute a useful class of organic polymerizable material. These polyesters are ordinarily esterification products of ethylenically unsaturated polycarboxylic acids and polyhydric alcohols. Usually, the ethylenic unsaturation is in the alpha, beta position.

The ethylenically unsaturated polycarboxylic acids include maleic acid, fumaric acid, aconitic acid, itaconic acid, citraconic acid, mesaconic acid, muconic acid and dihydromuconic acid and halo and alkyl derivatives of such acids. The preferred acids are maleic acid and fumaric acid. Especially preferred is maleic acid. Mixtures of ethylenically unsaturated polycarboxylic acids may be used or only a single such acid may be employed. The anhydrides of these acids, where the anhydrides exist, are, of course, embraced by the term "acid," since the polyesters obtained therefrom are essentially the same whether the acid or anhydride is used in the reaction.

One or more saturated polycarboxylic acids may optionally be utilized in combination with the ethylenically unsaturated acid or anhydride in the preparation of unsaturated polyesters. Such acids, especially the saturated dicarboxylic acids, increase the length of the polyester without adding additional crosslinking sites, which is a desired feature in some polyesters. Saturated tricarboxylic acids and saturated acids of higher carboxylic functionality may be used to provide branching where this is desirable.

For purposes of the present invention, the aromatic nuclei of aromatic acids such as phthalic acid are generally regarded as saturated since the double bonds do not ordinarily react by addition as do ethylenic groups. Therefore, wherever the term "saturated" is utilized, it is to be understood that such term includes aromatic unsaturation or other form of unsaturation which does not react by addition, unless otherwise qualified.

Examples of useful saturated polycarboxylic acids include oxalic acid, malonic acid, succinic acid, methylsuccinic acid, 2,2-dimethylsuccinic acid, 2,3-dimethylsuccinic acid, hexylsuccinic acid, glutaric acid, 2-methylglutaric acid, 3-methylglutaric acid, 2,2-dimethylglutaric acid, 3,3-dimethylglutaric acid, 3,3-diethylglutaric acid, adipic acid, pimelic acid, suberic acid, azelaic acid, sebaccic acid, phthalic acid, isophthalic acid, terephthalic acid, tetraclorophthalic acid, 1,2-hexahydrophthalic acid, 1,3-hexahydrophthalic acid, 1,4-hexahydrophthalic acid, 1,1-cyclobutanedicarboxylic acid and trans-1,4-cyclohexanedicarboxylic acid. As in the case of the ethylenically unsaturated polycarboxylic acids, the anhydrides of the saturated acids, where anhydrides exist, are embraced by the term "acid" since the polyesters obtained therefrom are essentially the same.

The ethylenically unsaturated polycarboxylic acids are usually present in an amount in the range of from about 10 mole percent to about 100 mole percent of the polycarboxylic acids employed. Preferably, they are present in the range of from about 50 mole percent to about 100 mole percent.

The polyhydric alcohols useful in preparing ethylenically unsaturated polyesters include saturated polyhydric alcohols such as ethylene glycol, 1,3-propanediol, propylene glycol, 2,3-butanediol 1,4-butanediol, 2-ethylbutane-1,4-diol, 1,5-pentanediol, 1,6-hexanediol, 1,7-heptanediol, 1,8-octanediol, 1,9-nonanediol, 1,10-decanediol, 2,10-decanediol, 1,4-cyclohexanediol, 1,4-dimethylolcyclohexane, 2,2-diethylpropane-1,3-diol, 2,2-dimethylpropane-1,3-diol, 3-methylpentane-1,4-diol, 2,2-diethylbutane-1,3-diol, 4,5-nonanediol, diethylene glycol, triethylene glycol, dipropylene glycol, glycerol, pentaerythritol, erythritol, sorbitol, mannitol, 1,1,1-trimethylolpropane, trimethylolethane, and 2,2-dimethyl-3-hydroxypropyl 2,2-dimethyl-3-hydroxypropionate. Etyleneically unsaturated polyhydric alcohols such as 2-butene-1,4-diol may be used alone or in admixture with the saturated polyhydric alcohols. Of course, mixtures of saturated polyhydric alcohols or mixtures of unsaturated polyhydric alcohols may be employed. If unsaturated polyhydric alcohols are used to introduce ethylenic unsaturation into the polyester, the preparation of ethylenically unsaturated polycarboxylic acid may be reduced correspondingly, if desired.

A mixture of ethylenically unsaturated polyesters containing a plurality of sites of ethylenic unsaturation may be used, if desired.

Another useful class of organic polymerizable material is polymer having a plurality of sites of acrylic unsaturation. The sites of acrylic unsaturation may be provided by acrylyl groups or $\alpha$-substituted acrylyl groups such as methacrylyl, ethacrylyl and $\alpha$-chloroacrylyl. The sites of acrylic unsaturation may be terminal groups of the polymer, they may be in sidechains attached to the molecular backbone of the polymer or both.

Polymers having acrylic unsaturation in sidechains attached to the molecular backbone are usually prepared by including one or more monomers which, when interpolymerized with other monomers, to form the polymer, provides reactive sites attached to the polymer along the backbone. Acrylically unsaturated compounds having at least one functional group which will react with the reactive sites on the polymeric backbone are then used to introduce the acrylic unsaturation into the molecule. The usual reactive sites attached directly or indirectly to the polymer are hydroxy, amino, carboxy, carbamyl, isocyanato or epoxy. Hydroxy or carboxy are most often used. When the reactive sites are hydroxy, the acrylically unsaturated compound usually has carboxy, haloformyl (most often chloroformyl) or isocyanato functionality. When the reactive sites on the polymer are amino, the acrylically unsaturated compound usually has isocyanato, haloformyl (again, most often chloroformyl) or epoxy functionality. When the reactive sites on the polymer are carboxy, the acrylically unsaturated compound generally has hydroxy, epoxy or isocyanato functionality. When the reactive sites are carbamyl, they are usually reacted with formaldehyde to produce N-methylol carbamyl groups. When the reactive sites are isocyanato, the acrylically unsaturated compound ordinarily contains hydroxy or carboxy functionality. When the reactive sites are epoxy (usually glycidyl), the acrylically unsaturated compound generally has carboxy functionality. The acrylically unsaturated compound ordinarily contains carboxy, haloformyl or isocyanato functionality.

The polymer having reactive sites attached thereto can itself be any of many types, as for example, polyacrylates, polyamides, polyesters, polyethers or polyurethanes.

The term polyacrylate is used in its broadest sense to include not only polymerized unsubstituted acrylates, but also polymerized $\alpha$-substituted acrylates, such as methacrylates, ethacrylates and $\alpha$-chloroacrylates. Compounds from any of these subclasses may be used alone, but most often, compounds from two or more subclasses are interpolymerized.

Examples of suitable monomers which may be used in the preparation of the polyarcylate polymer include methyl acrylate, ethyl acrylate, propyl acrylate, isopropyl acrylate, butyl acrylate, isobutyl acrylate, sec-butyl acrylate, tert-butyl acrylate, amyl acrylate, hexyl acrylate, heptyl acrylate, octyl acrylate, 2-ethylhexyl acrylate, decyl acrylate, dodecyl acrylate, methyl methacrylate, ethyl methacrylate, propyl methacrylate, isopropyl methacrylate, butyl methacrylate, isobutyl methacrylate, sec-butyl methacrylate, tert-butyl methacrylate, amyl methacrylate, hexyl methacrylate, heptyl methacrylate, octyl methacrylate, 2-ethylhexyl methacrylate, decyl methacrylate, dodecyl methacrylate methyl α-chloroacrylate, ethyl α-chloroacrylate, propyl α-chloroacrylate, hexyl α-chloroacrylate, octyl α-chloroacrylate, decyl α-chloroacrylate and dodecyl α-chloroacrylate. Esters of unsubstituted acrylic acid and methacrylic acid are most often used.

Acrylic monomers which introduce reactive sites to the polymer molecule include acrylic acid, 2-hydroxyethyl acrylate, 2-hydroxypropyl acrylate, 3-hydroxypropyl acrylate, glycidyl acrylate, acrylamide, 2-aminoethyl acrylate, methacrylic acid, 2-hydroxyethyl methacrylate, 2-hydroxypropyl methacrylate, 3-hydroxypropyl methacrylate, glycidyl methacrylate, methacrylamide, 2-aminoethyl methacrylate, 3-aminopropyl methacrylate and α-chloroacrylic acid.

Other ethylenically unsaturated monomers are often included. Examples of these compounds are styrene and α-methylstyrene.

The amount of acrylic monomers which are used to introduce reactive sites to the polymer molecule may vary widely, but they are ordinarily present in the range of from about 3 percent to about 50 percent by weight of the ethylenically unsaturated monomers interpolymerized. An amount in the range of from about 4 percent to about 25 percent is most often the case.

Addition polymerization may be effectuated by combining the ethylenically unsaturated monomers with a free radical initiator and heating the mixture. Exemplary free radical initiators are organic peroxides such as ethyl peroxide and benzoyl peroxide; hydroperoxides such as methyl hydroperoxide, certain azo compounds such as α,α'-azobisisobutyronitrile and γ,γ'-azobis(γ-cyanovaleric acid); persulfates; peracetates such as methyl peracetate and tert-butyl peracetate; peroxalates such as dimethyl peroxalate and di(tert-butyl) peroxalate; disulfides such as dimethyl thiuram disulfide and ketone peroxides such as methyl ethyl ketone peroxide. The polymerization may be accomplished in the presence or absence of an inert solvent. Temperatures in the range of from about 75° F. to about 400° F. are generally employed. More often, temperatures in the range of from about 100° F. to about 300° F. are used.

When the polymer is a polyamide, polyester, polyether or polyurethane, the principles are analogous to those given for the polyacrylates. The known reactions for forming such polymers will, of course, be used instead of the addition polymerization reaction illustrated above for the polyacrylates.

Other examples of satisfactory polymers having a plurality of sites of acrylic unsaturation are acrylic polyester and acrylic polyamide molecules represented by the formulae:

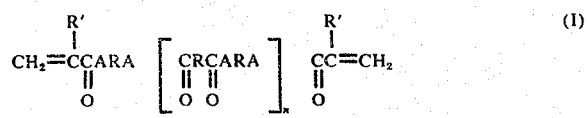

and

wherein n is an interger in the range of from 1 to 4;

each R independently represents a divalent aliphatic, cycloaliphatic or aromatic hydrocarbon radical having from 1 to 10 carbon atoms;

each R' independently represents hydro, methyl or ethyl;

and each A independently represents 0 or NH.

It is preferred that every A represent 0. The polyester and polyamide oligomers represented by formula (I) may be prepared by reacting dicarboxylic acids or acid amides and dihydric alcohols or diamines and then reacting the product with an unsubstituted acrylic acid or an α-substituted acrylic acid. The acrylic polyester and polyamide oligomers represented by formula (II) may be prepared by reacting a hydroxy functional monocarboxylic acid, a dimer, trimer or a tetramer of such acid, an amino functional monocarboxylic acid or a dimer, trimer or tetramer of such acid with an unsubstituted or α-substituted acrylic acid. Where desired, the lactone may be used in lieu of the hydroxy functional monocarboxylic acid and the lactam may be used in place of the amino functional monocarboxylic acid.

A mixture of polymers having a plurality of sites of acrylic unsaturation may be used, if desired.

Another useful class of organic polymerizable material is monomer having a plurality of sites of acrylic unsaturation. Such monomers generally comprise divalent, trivalent or tetravalent organic radicals whose bonds are satisfied with unsubstituted acrylyloxy or α-substituted acrylyloxy groups. The polyvalent radical may be aliphatic, cycloaliphatic or aromatic. Usually, the molecular weight of the monomer is in the range of from about 170 to about 1000. Examples of such monomers are the diacrylates and dimethacrylates of ethylene glycol, 1,3-propanediol, propylene glycol, 2,3-butanediol, 1,4-butanediol, 2-ethylbutane-1,4-diol, 1,5-pentanediol, 1,6-hexanediol, 1,7-heptanediol, 1,8-octanediol, 1,9-nonanediol, 1,10-decanediol, 2,10-decanediol, 1,4-cyclohexanediol, 1,4-dimethylolcyclohexane, 2,2-dimethylpropane-1,3-diol, 3-methylpentane-1,4-diol, 4,5-nonanediol, diethylene glycol, triethylene glycol, propylene glycol, 5,5-dimethyl-3,7-dioxanonane-1,9-diol, 2,2-dimethyl-3-hydroxypropyl 2,2-dimethyl-3-hydroxypropionate, Bishpenol A-diglycidyl ether, 1,4-butanediol diglycidyl ether and neopentyl glycol diglycidyl ether; the triacrylates, trimethacrylates, diacrylates and dimethacrylates of glycerol, 1,1,1-trimethylolpropane and trimethylolethane; and the tetracylates, tetramethacrylates, trimethyacrylates, diacrylates and dimethacrylates of pentaetythritol and erythritol. The acrylic groups on the monomer molecules are usually the same, but they may be different as exemplified by the compound 2,2-dimethyl-1-acryloxy-3-methacrylyloxypropane.

A mixture of monomers having a plurality of sites of acrylic unsaturation may be used, if desired.

Additional monomers having one or more vinyl groups which crosslink with the organic polymerizable material containing a plurality of sites of ethylenic unsaturation heretofore described may optionally be present in the composition. Examples are N-vinyl-2-pyrrolidine, styrene, α-methylstyrene, divinyl benzene, vinyl toluene, vinyl benzoate, vinyl acetate, vinyl propionate and diallyl phthalate. Particularly preferred are monomers having monoacrylic functionality which crosslink with the resin having acrylic unsaturation which may optionally be present in the coating composition. Examples of monoacrylic functional monomers which may be used are methyl acrylate, methyl methacrylate, ethyl acrylate, ethyl methacrylate, propyl acrylate, propyl methacrylate, butyl methacrylate, hexyl acrylate, hexyl methacrylate, octyl acrylate and octyl methacrylate. The preferred vinyl functional monomers are liquid compounds miscible with the resin. The use of one or more vinyl functional monomers is desirable. A benefit is that the vinyl functional monomer usually acts as a reactive solvent for the resin thereby providing compositions having a satisfactorily low viscosity without using an inordinate amount, if any at all, of volatile, nonreactive solvent.

The vinyl functional monomer, or mixtures of vinyl functional monomers, may be employed over a broad range. At the lower end of the range, no vinyl functional monomer need be used. At the upper end of the range, about 80 percent by weight of the binder can be vinyl functional monomer. Often, the vinyl functional monomer will be present in the coating composition in the range of from about 1 to about 80 percent by weight of the binder of the coating composition. Ordinarily when used, the vinyl functional monomer will be in the range of from about 15 to about 30 percent by weight of the binder.

Extender pigments which are generally transparent to ultraviolet light are optional ingredients which are often included in the composition. Examples of suitable extender pigments are finely divided particles of silica, barytes, calcium carbonate, talc, magnesium silicate, aluminum silicate etc. When used, extender pigment is generally present in an anount in the range of from about 1 to about 70 percent by weight of the composition. An amount in the range of from about 1 to about 50 percent is more often employed. Most often, it is present in the range of from about 1 to about 35 percent by weight of the composition. Although a single extender pigment is ordinarily used, mixtures of several extender pigments are satisfactory.

Ultraviolet light absorbing pigments may optionally be used in amounts which do not preclude polymerization of the interior of the actinic light curable composition. The maximum amount is therefore related to the thickness of the composition to be polymerized. Thin coatings may tolerate more ultraviolet light absorbing pigment than thick coatings. When ultraviolet light absorbing pigment is used, it is usually present in the range of from about 1 percent to about 70 percent by weight based on the weight of the binder. For thicker sections, from about 1 percent to about 50 percent are ordinarily satisfactory. Examples of suitable ultraviolet light absorbing pigments are titanium dioxide, antimony oxide, zinc oxide, zirconium oxide, zinc sulfide and lithopone. Mixtures of pigments may be used.

Another optional ingredient which is often included in the composition is an inert volatile organic solvent. Mixtures of several inert volatile organic solvents may be used when desired. Examples of suitable inert volatile organic solvents are acetone, methyl ethyl ketone, methyl isobutyl ketone, methyl alcohol, ethyl alcohol, propyl alcohol, isopropyl alcohol, butyl alcohol, sec-butyl alcohol, isobutyl alcohol, tert-butyl alcohol, amyl alcohol, hexyl alcohol, 2-ethylhexyl alcohol, cellosolve, ethyl cellosolve, cellosolve acetate, 2-ethylhexyl acetate, tetrahydrofuran, and aliphatic naphtha. When inert volatile organic solvent is used, it is usually present in the range of from about 1 to about 15 percent by weight of the vehicle.

Another optional ingredient is resinous pigment dispersant or grinding vehicle. There are many resinous dispersants which are commercially available for that purpose. These resins are often low molecular weight resins which have a high carboxyl content. Illustrative of such pigment dispersants are the so-called acrysol dispersants such as Acrysol I-94, a copolymer of butyl acrylate, methyl methacrylate, styrene and acrylic acid, available commercially from the Rohm and Haas Company. These dispersants are used in the manner and in amounts known to the art.

Conventional plasticizers such as dibutyl phthalate, butyl benzyl phthalate, diisooctyl phthalate, decyl butyl phthalate, diisooctyl adipate, dibutyl sebacate, butyl benzoate triisooctyl trimellitate, n-octyl n-decyl trimellitate, and tricresyl phosphates and flow promoters such as phenyl benzoate, dibenzyl ketone, benzyl methyl ketone and the like may also be optionally included in amounts customary in the art.

Various conventional chain modifying agents or chain-transfer agents may be included in the mixture. The preferred chain-transfer agents are the mercaptan compounds such as dodecyl mercaptan, tertiary-dodecyl mercaptan, octyl mercaptan, hexyl mercaptan and the like. The quantity and manner of use are also known in the art.

Any of the conventional viscosity control agents may be optionally employed in the composition. The preferred materials are resinous or polymeric viscosity control agents. Many of these resinous materials are available. Illustrative of such materials are cellulose acetate butyrate, sodium carboxymethyl cellulose and the like. The use of such resinous or polymeric viscosity control agents is advantageous in that it permits the mixture to be prepared in the form of a viscous mass or syrup having sufficient viscosity to remain in place on the substrate until polymerization is effected. These viscosity control agents are used in the manner and in amounts known to the art.

The amount of aromatic ketone photopolymerization activator present in the actinic light polymerizable compositions of the invention may be widely varied. Usually, the photopolymerization activator is present in an amount in the range of from about 0.01 percent to about 50 percent based on the weight of the binder of the coating composition. More often, an amount in the range of from about 0.1 percent to about 20 percent is employed. From about 0.5 to about 10 percent by weight based on the weight of the binder is preferred.

The amount of organic polymerizable material having a plurality of sites of ethylenic unsaturation present in the polymerizable composition is subject to wide variation. The material is ordinarily present in an amount in the range of from about 20 to 100 percent by weight of the binder of the composition. An amount in the range of from about 50 to 100 percent is typical. From about 80 to 100 percent by weight of the binder is preferred.

The polymerizable compositions of the invention are usually prepared by simply admixing the various ingredients. The compounds comprising the photocatalyst system may be premixed and then admixed with the other ingredients of the coating composition or they may be added separately. Although mixing is usually accomplished at room temperature, elevated temperatures are sometimes used. The maximum temperature which is usable depends upon the heat stability of the ingredients. Temperatures above about 200° C. are only rarely employed.

The actinic light polymerizable compositions of the invention are generally used to form cured adherent coatings on substrates. The substrate is coated with the polymerizable composition using substantially any technique known to the art. These include spraying, curtain coating, dipping, roller application, printing, brushing, drawing and extrusion. The coated substrate is then exposed to ultraviolet light to cure (viz., C-stage) the coating into a hard, infusible film throughout its thickness.

The thicknesses of polymerized coatings of the actinic light polymerizable composition of the invention are subject to wide variation. Usually, such thicknesses are in the range of from about 0.001 millimeter to about 1 millimeter. More often, they are in the range of from about 0.005 millimeter to about 0.3 millimeter. Typically, they are in the range of from about 0.012 millimeter to about 0.15 millimeter. When the actinic light polymerizable composition is an actinic light polymerizable printing ink, the polymerized coatings usually have thicknesses in the range of from about 0.001 millimeter to about 0.03 millimeter.

The coatings may be polymerized by exposing the coated substrate to actinic light. Usually, the actinic light is ultraviolet light having a wavelength in the range of from about 185 to about 400 nanometers.

Any suitable sources of actinic light may be used in the practice of this invention. Suitable sources are mercury arcs, carbon arcs, low pressure mercury lamps, medium pressure mercury lamps, high pressure mercury lamps, swirl-flow plasma arc, radio frequency induced mercury lamps and ultraviolet light emitting xenon flash lamps. Particularly preferred are ultraviolet light emitting lamps of the medium or high pressure mercury vapor type. Such lamps usually have fused quartz envelopes to withstand the heat and transmit the ultraviolet radiation and are ordinarily in the form of long tubes having an electrode at either end. Examples of these lamps are PPG Models 60—2032, 60—0393, 60—0197 and 60—2031 and Hanovia Models 6512A431, 6542A431, and 6577A431.

The times of exposure to actinic light and the intensity of the actinic light to which the polymerizable composition is exposed may vary greatly. Generally, the exposure to actinic light is contained until the C-stage is reached where the film is hard and infusible throughout its thickness, although in some instances, as for example in the formation of pressure sensitive adhesives, the exposure is continued only to form a gel (viz., B-stage).

Substrates which may be coated with the compositions of this invention may vary widely in their properties. Organic substrates such as wood, fiberboard, particle board, composition board, paper, cardboard and various polymers such as polyesters, polyamides, cured phenolic resins, cured aminoplasts, acrylics, polyurethanes and rubber may be used. Inorganic substrates are exemplified by glass, quartz and ceramic materials. Many metallic substrates may be coated. Exemplary metallic substrates are iron, steel, stainless steel, copper, brass, bronze, aluminum, magnesium, titanium, nickel, chromium, zinc and alloys. Strippable substrates or substrates including a release coating are sometimes used, particularly when the polymerized composition is an adhesive.

The photopolymerization of compounds containing acrylyl or $\alpha$-substituted acrylyl groups such as methacrylyl groups is often inhibited by the presence of oxygen. The oxygen content of air is, in many instances, sufficient to preclude curing the thin layer of the coating having a surface which is adjacent to the air. In many cases, the interior of the coating may be adequately cured, but oxygen inhibition causes the surface to remain tacky and unsuitable for most applications. This phenomenon is known in the art as inadequate "surface cure." Although it is not desired to be bound by any theory, it is believed that the inhibition is due to the formation of peroxide at the site of chain propagation which quenches the reaction and thereby terminates chain growth.

It has now been found that the oxygen inhibition of the photopolymerization of resins containing acrylic groups may be substantially reduced by employing at least one aromatic ketone photopolymerization activator of the invention. Accordingly, substrates coated with the polymerizable compositions of the present invention may not only be exposed to actinic light in the presence of an inert atmosphere, viz., an atmosphere either containing no oxygen or only a concentration of oxygen which produces an insignificant degree of polymerization inhibition, but also in the presence of an atmosphere containing a polymerization inhibiting concentration of oxygen, such as air.

The actinic light polymerizable compositions of the present invention are particularly useful for coating steel and aluminum food and beverage cans.

In the illustrative examples which follow, all parts are parts by weight and percentages are percent by weight unless otherwise specified.

EXAMPLE I

A reactor equipped with a thermometer, a heater, a pressure equalizing addition funnel and an agitator is charged with 275 parts acrylic acid, 4 parts N,N-dimethylcyclohexylamine, 1.6 parts 2,6-di-tert-butyl-p-cresol and 0.015 part hydroquinone. The charge is then heated to 100° C. and 500 parts 1,4-butanediol diglycidyl ether (Araldite RD-2, Ciba Geigy) is added dropwise over 6 hours. After the addition is completed, the mixture is held at 100° C. for 2 hours and then cooled to produce a diacrylate of 1,4-butanediol diglycidyl ether product having an acid value of 6.

Seventy-four parts titanium dioxide and 106 parts of the diacrylate of 1,4-butanediol diglycidyl ether are ground to form a paste. An intermediate composition is prepared by admixing 155 parts of the paste and 5 parts tributylphosphine.

A first coating composition is prepared by admixing 25 parts of the intermediate composition and 0.75 part ethyl phenylglyoxylate.

A second coating composition is prepared by admixing 25 parts of the intermediate composition and 0.75 part benzophenone.

Each coating composition is drawn down onto separate aluminum substrates with a number 006 wire wound bar to provide films having thicknesses of about 0.008 millimeter. The coated substrates are pressed twice at 9.1 meters per minute, in air, under four medium pressure mercury vapor lamps, each operating at 78.7 watts per centimeter and emitting both ultraviolet light and visible light. The lamps are 8.89 centimeters above the plane of the substrate surface and are spaced apart at intervals of about 20.3 centimeters. The coating of the first coating composition is found to be polymerized to a wrinkle-free dry coating with fair adhesion to the substrate. The coating of the second coating composition is found to be wrinkled and wet to the touch.

EXAMPLE II

A reactor equipped with a therometer, a heater, a cooler an agitator, a condenser set for total reflux, a source of air and a source of nitrogen is charged with 1150 parts acrylic acid, 0.44 part methyl hydroquinone, 6.1 parts 2,6-di-tert-butyl-4-metylphenol, 21.1 parts 2-[2-[4-(1,1,3,3-tetramethylbutyl)-3-methylphenoxy]ethoxy]ethyl dimethyl benzyl ammonium chloride monohydrate and 205 parts toluene and a slight air sparge is applied. The charge is then heated to 170° C. Over a period of 3½ hours, 2915 parts bisphenol A-diglycidyl ether (Epon 828; Shell Chemical Co.) which has been preheated to a temperature in the range of from 51.6° C. to 54.6° C. is added to the reactor while maintaining the temperature of the reaction mixture in the range of from 107° C. to 109° C. Upon completion of the addition, the temperature of the reaction mixture is held in the range of from 107° C. to 110° C. for 3¾ hours. At the end of this period, the condenser is set for total distillation, viz., no condensate is returned to the reactor, and both air and nitrogen sparges are applied. The reaction mixture is held at a temperature in the range of from 108° C. to 113° C. for 5 hours and distillate is removed. At the conclusion of this period, heat is shut off, cooling is applied and a slight air sparge is maintained. One hour later when the temperature has reached 90.6° C., the product is discharged from the reactor through a nylon bag filter into containers. This product, which is the diacrylate of bisphenol A-diglycidyl ether, is found to have an acid number of 0.5, a hydroxyl number of 214 and to contain 0.01 percent water and 0.2 percent toluene. A 75 percent solution of the product in ethyl cellosolve has a Gardner-Holdt viscosity of T-U. The product may be depicted as having the structural formula:

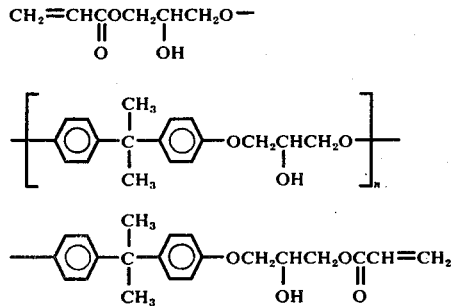

where the value of $n$ is in the range of from 0 to about 1.

A reactor equipped with a heater, a cooler, an agitator, a distillation column, condenser, phase separator, a source of air and a source of nitrogen is charged with 1150 parts 2,2-dimethylpropane-1,3-diol (viz., neopentyl glycol), 1830 parts acrylic acid and 66.5 parts hydroquinone. The condenser and phase separator are set for azeotropic distillation and heat is applied to melt the charge. Three hundred twenty-five parts cyclohexane and 165 parts p-toluene sulfonic acid are added to the melt. The reaction mixture is then heated to 79° C. when reflux is observed and the removal of water is begun. Three hours and ten minutes later when 403 parts water have been removed and the temperature has risen to 102° C., 55 parts cyclohexane is added. After a period of 55 minutes, the temperature has dropped to 99° C. Over the next 1½ hours, the temperature rises to 103° C. At this point, a total of 479 parts water has been removed. The source of heat is thereupon removed, cooling is applied and the removal of water is halted. When the temperature has dropped to 27° C., filtration of the reaction mixture through a filter bag into a container is begun. Twenty-five minutes later (temperature: 23° C.), the filtration is completed and the addition of 1445 parts cyclohexane is begun. Thirty minutes later (temperature: 18° C.), the addition is completed. Approximately half of the filtered reaction mixture is charged back into the reactor and washed with 455 parts of 20 percent aqueous sodium hydroxide solution. After withdrawing the aqueous layer, the organic layer is discharged into containers. The remaining half of the filtered reaction mixture is charged to the reactor. Thereafter, 1500 parts cyclohexane and 455 parts 20 percent aqueous sodium hydroxide solution are added and the mixture well agitated. After settling, the aqueous layer is removed. The organic layer is discharged into containers and the reactor is flushed with cyclohexane which is removed. The washed product is then transferred from containers to the reactor in two increments. Additions totaling 5.6 parts p-methoxyphenol are made. After mixing well, the material is discharged into containers. The material is next passed through a continuous vacuum flash-stripper operating at an absolute pressure of about 17 kilopascals (1 pascal=1 newton per square meter) and a temperature of about 127° C. where 1429 parts stripped product and 3134 parts condensed vapor (essentially cyclohexane) are recovered. The stripped product is found to have an acid number of 0.9, a Gardner-Holdt viscosity of A$^-$, a Gardner color of 1–2 and to contain 0.06 percent water. Next, 1350 parts of the stripped product is subjected to further stripping in a batch vacuum distillation apparatus until the temperature of the remaining liquid (1250 parts) is 54.4° C. at an absolute pressure of 3.2 kilopascals. The liquid is cooled to about 27° C., the vacuum is broken with nitrogen and the product is discharged into containers. The product is a 1,3-bis(acrylyloxy)-2,2-dimethylpropane (viz., diacrylate of neopentyl glycol) composition having a solids content of 99+ percent, a Gardner-Holdt viscosity of A$^-$, an acid number of less than one and a Gardner color of less than one.

A mixed resin composition is prepared by admixing 500 parts of the diacrylate of bisphenol A-diglycidyl ether and 500 parts of the 1,3-bis(acrylyloxy)-2,2-dimethylpropane composition.

A first coating composition is prepared by admixing 100 parts of the mixed resin composition and 2 parts ethyl phenylglyoxylate.

A second coating composition is prepared by admixing 100 parts of the mixed resin composition and 2 parts dimethylbenzil.

A third coating composition is prepared by admixing 100 parts of the mixed resin composition and 2 parts benzophenone.

Each coating composition is drawn down on a plurality of separate substrates. Substrates coated with each coating composition are passed once, in air, under a source of ultraviolet light at various speeds in order to ascertain the maximum speed at which polymerization to a hard, dry coating could be obtained. The maximum speed for satisfactorily polymerizing the first coating composition is found to be 15.2 meters per minute. The maximum speed for the second coating composition is found to be much less than 15.2 meters per minute. The coating of the third coating composition is observed to be substantially unpolymerized at a speed of 9.1 meters per minute.

EXAMPLE III

The preparation of 3-acrylyloxy-2,2-dimethylpropyl 3-acrylyloxy-2, 2-dimethylpropionate is described in Example 1 of U.S. Pat. No. 3,645,984.

A first coating composition is prepared by admixing 100 parts of 3-acrylyloxy-2,2-dimethylpropyl 3-acrylyloxy-2,2-dimethylpropionate and 2 parts phenylglyoxylic acid.

A second coating composition is prepared by admixing 100 parts of 3-acrylyloxy-2,2-dimethylpropyl 3-acrylyloxy-2,2-dimethylpropionate and 2 parts isobutyl benzoin ether.

A third coating is prepared by admixing 100 parts of 3-acrylyloxy-2,2-dimethylpropyl 3-acrylyloxy-2,2-dimethylpropionate and 2 parts benzoyl cyanide.

Each coating composition is drawn down on a plurality of separate aluminum substrates. Substrates coated with each coating composition are passed once, in a nitrogen atmosphere, under a source of ultraviolet light at various speeds in order to ascertain the maximum speed at which polymerization to a hard, dry coating which is resistant to fingernail scratching, could be obtained. For the first coating composition, the maximum speed at which the surface is mar free after the fingernail scratch test is 15.2 meters per minute. For the second coating composition, the maximum speed at which the surface is mar free after the fingernail scratch test is 27.4 meters per minute. For the third coating composition, the maximum speed at which the surface is mar free after the fingernail scratch test is 9.1 meters per minute.

EXAMPLE IV

A urethane resin is prepared in a conventional manner from 2 molar parts 2-hydroxyethyl acrylate and one molar part 2,2,4-trimethylhexamethylene diisocyanate.

A first coating composition is prepared by admixing 100 parts 4-hydroxybutyl acrylate, 60 parts of the urethane resin and 3.2 parts isobutyl benzoin ether.

A second coating composition is prepared by admixing 10 parts of the first coating composition and 0.2 part ethyl phenylglyoxylate.

A third coating composition is prepared by admixing 10 parts of the first coating composition and 0.2 part benzophenone.

Each coating composition is drawn down on two separate substrates. One substrate coated with each coating composition is passed once, in air, under a source of ultraviolet light operating at 2 kilowatts, at a speed of 3.05 meters per minute. The other substrate coated with each coating composition is passed once, in air, under the same source of ultraviolet light at a speed of 6.1 meters per minute. After passage under the source of ultraviolet light, coatings of the first coating composition remain wet to the touch at speeds of both 3.05 meters per minute and 6.1 meters per minute whereas coatings of the second and third coating compositions become hard and dry at these speeds.

EXAMPLE V

A coating composition is prepared by admixing 100 parts of the diacrylate of 1,4-butanediol diglycidyl ether of Example I, 2 parts N,N-dimethylcyclohexylamine and 2 parts methyl phenyl glyoxylate.

The coating composition is drawn down on a substrate and the coated substrate is passed once at 61.0 meters per minute, in air, under the ultraviolet light emitting lamps of Example I to produce a hard, dry coating.

EXAMPLE VI

A reactor equipped with an agitator, a heater, a packed distillation column, a condenser, thermometers and a source of nitrogen is charged with 272.8 parts ethylene glycol, 296 parts phthalic anhydride and 0.57 part butyl stannoic acid. A nitrogen sparge is applied, the contents of the reactor are heated to 195° C. and water is removed from the system. Fifty minutes later, the temperature has risen to 210° C. The temperature is then held in the range of from about 209° C. to about 210° C. for 40 minutes while water is removed. At the end of this time, the distillation column is bypassed so that the vapor from the reactor is vented through a condenser in a manner such that condensate is not returned to the reactor. The liquid is maintained at temperatures in the range of from about 209° C. to about 211° C. for 1¼ hours and then discharged into containers. The product polyester resin has an acid number of 0.84, a Gardner-Holdt viscosity of Z-2$^+$ and a total solids content greater than 99 percent.

A reactor equipped with a heater, a cooler, an agitator, a distillation column, condenser, phase separator, a vacuum source, a source of air and a source of nitrogen is charged with 777 parts of the above polyester resin, 475 parts acrylic acid, 173 parts toluene and 9.6 parts hydroquinone. The condenser and phase separator are set for total reflux. The reaction mixture is heated to 49° C. at an absolute pressure of about 80 kilopascals and 28.7 parts sulfuric acid is added. The absolute pressure is reduced to about 67 kilopascals and refluxing is observed. The condenser and phase separator are set for azeotropic distillation. One hour later (temperature: 89° C.; absolute pressure: 43 kilopascals), 52 parts water has been removed. After another hour (temperature: 94° C.; absolute pressure: 36 kilopascals), a total of 98 parts water has been removed. After another 45 minutes (temperature: 85° C.; absolute pressure: 24 kilopascals), a total of 102 parts water has been removed. Heat is then removed and cooling is applied. When the temperature reaches 24° C., the vacuum is broken with nitrogen, 2210 parts toluene and 170 parts normal hexane are added and the mixture is well agitated. The mixture is then washed with 340 parts 20 percent aqueous sodium hydroxide solution using agitation while maintaining the temperature below 27° C. Agitation is stopped and the phases are allowed to separate. The aqueous layer is removed and 25 parts sodium sulfate is added and admixed with the organic phase. The mixture is filtered into containers to remove solid material. The filtrate (3188 parts) is charged back into the reactor. A solution is prepared by admixing 1.6 parts hydroquinone and 13.3 parts acetone and the solution (14.9 parts) is added to the reactor. The condenser is set for vacuum distillation. A vacuum is applied to reduce the absolute pressure to about 46.7 kilopascals, the contents of the reactor are heated to 60° C. and the removal of distillate is begun. The temperature of the liquid is maintained in the range of from about 52° C. to about 60° C. for 8⅓ hours while the absolute pressure is gradually reduced to 13.3 kilopascals, and 1835 parts distillate is removed. During the next 3 hours 25 minutes, the absolute pressure is increased to 16 kilopascals and the temperature is increased to 61° C. At this time, a total of 2263 parts distillate has been removed. Distillation is stopped, heat is removed and cooling is begun. When the temperature reaches 27° C., the vacuum is broken with nitrogen. The stripped product, amounting to 896 parts, is admixed with 180 parts methanol and the mixture is subjected to stripping by batch vacuum distillation until the temperature of the remaining liquid is 60° C. at an absolute pressure of 3.3 kilopascals. The product, amounting to 769 parts, is cooled to about 27° C., the vacuum is broken with nitrogen and the product is discharged into containers. This product, a polyester diacrylate, has a solids content of greater than 99 percent, an acid number of 0.84 and a hydroxyl number of 13.

Several pairs of coating compositions are prepared by admixing (A) 2 parts ethyl phenylglyoxylate and 100 parts of an ultraviolet light curable resin, and (B) 2 parts isobutyl benzoin ether and 100 parts of the same resin. Each coating composition is drawn down onto an aluminum substrate with a number 010 wire wound bar. The coated substrates are passed once, in air, under the ultraviolet light emitting lamps of Example I. The exposed coatings are tested for mar resistance by scratching with a fingernail. Stability to heat is tested by placing the exposed coated substrates in a dark 65.6° C. oven until the coating gels or for 20 days, whichever first occurs. The identities of the resins, speeds of passage under the lamps (meters per minute), the mar resistances and the heat stabilities are shown in Table I, which follows.

110° C. A mixture comprising 385 parts epichlorohydrin and 166.6 parts Epon 828 bisphenol A-diglycidyl ether is preheated to about 110° C. Over a period of 4 hours, 551.6 parts of the preheated mixture is added to the reactor while maintaining the temperature of the reaction mixture in the range of from 110° C. to 111.7° C. Upon completion of the addition, the temperature of the reaction mixture is held in the range of from 110° C. to 113° C for 75 minutes. At the end of this period (temperature: 112.2° C.), heat is shut off and cooling is applied. Fifteen minutes later (temperature: 96.1° C.), the condenser is set for distillation, a slight vacuum of 12 kilopascals is applied while maintaining an air sparge and distillation is begun. Two hours later (temperature: 97.8° C.), 21 parts distillate has been removed and the vacuum is removed. Thirty minutes later (temperature: 97.2° C.), a slight vacuum of 10.7 kilopascals is applied while maintaining an air sparge and distillation is again begun. Two hours later (temperature: 97.2° C.), 7 additional parts distillate has been removed and the vacuum and air sparge are removed. Fifteen minutes later (temperature: 97.8° C.), the vacuum and air sparge are reapplied. Thirty minutes later (temperature: 97.8° C.), the vacuum and air sparge are removed, heat is shut off and cooling is applied. Forty-five minutes later when the temperature has reached 54.4° C., the product is discharged through a filter into containers. This intermediate product, which is a mixture of 3-chloro-2-hydroxypropyl acrylate, 2-chloro-1-(hydroxymetyl)ethyl acrylate and the diacrylate of Epon 828 bisphenol A-diglycidyl ether, is found to have an acid number of 3.9, a Gardner-Holdt viscosity of K, a hydroxyl number of 242 and to contain 0.02 percent water and 14.1 percent chlorine.

Coating Composition A is prepared by admixing 50 parts of the intermediate product and 1 part benzophenone.

Coating Composition B is prepared by admixing 50 parts of the intermediate product, 0.5 part benzophenone and 0.5 part N,N-dimethylethanolamine.

Coating Composition C is prepared by admixing 50 parts of the intermediate product and 1 part isobutyl benzoin ether.

Coating Composition D is prepared by admixing 50 parts of the intermediate product and 1 part α,α-diethoxyacetophenone.

Coating Composition E is prepared by admixing 50 parts of the intermediate product and 1 part methyl phenylglyoxylate.

Table I

| | Photopolymerization Activator | | | | | |
|---|---|---|---|---|---|---|
| | Ethyl Phenylglyoxylate | | | Isobutyl Benzoin Ether | | |
| Resin[1] | Speed, M/Min | Mar Resistance | Heat Stability, Days | Speed, M/Min | Mar Resistance | Heat Stability, Days |
| 1 | 3.05 | Slight Mar | >20 | 3.05 | Slight Mar | <1 |
| 2 | 3.05 | Slight Mar | >20 | 3.05 | Slight Mar | <1 |
| 3 | 24.4 | Mar Free | >20 | 24.4 | Mar Free | <1 |
| 4 | 6.1 | Slight Mar | >20 | 6.1 | Slight Mar | <1 |
| 5 | 3.05 | Wet | 20 | 3.05 | Mar | <1 |

[1]Resin Identities:
1. Polyester diacrylate.
2. A mixture conprising 70 percent of the diacrylate of bisphenol A-diglycidyl ether and 30 percent 2-hydroxyethyl acrylate.
3. The diacrylate of 1,4-butanediol diglycidyl ether.
4. A mixture comprising 75 percent of the diacrylate of bisphenol A-diglycidyl ether and 25 percent of the trimethacrylate of 1,1,1-trimethylolpropane.
5. 1-Acrylyloxy-3-methacrylyloxy-2-hydroxypropane.

EXAMPLE VII

A reactor equipped with a thermometer, a heater, a cooler, an agitator, a condenser set for total reflux, a source of air and a source of nitrogen is charged with 380.8 parts acrylic acid, 1.87 parts 2,6-di-tert-butyl-4-methylphenol and 1.86 parts triphenyl phosphine and an air sparge is applied. The charge is then heated to Each coating composition is drawn down on a plurality of separate aluminum substrates using a number 014 wire wound draw bar to produce coatings having thicknesses of about 0.02 millimeter. The coated substrates are each passed once, in air, at speeds in the range of from 6.1 to 30.5 meters per minute under the ultraviolet light emitting lamps of Example I.

The maximum speed at which no fingernail mark could be made in the exposed coatings and at which the coating could not be removed by scratching with a fingernail is ascertained for each coating composition. The results are shown in Table 2.

Table 2

| Coating Composition | Maximum Curing Speed for Mar-Free Coating, M/Min |
|---|---|
| A | 9.1 |
| B | 18.3 |
| C | 9.1 |
| D | 21.3 |
| E | 27.4 |

EXAMPLE VIII

Five coating compositions are each prepared by admixing 50 parts of the intermediate product of Example VII and a photopolymerization activator. The amounts by weight of photopolymerization activated used are such that the coating compositions contain about the same molar amount of photopolymerization activator. Each coating composition is drawn down on a plurality of aluminum substrates. Some coated substrates are passed once, in air, at various speeds under the ultraviolet light emitting lamps of Example I and the degree of cure is ascertained by the fingernail test. The maximum speed which provides little or no mar is determined. Other coated substrates are similarly exposed in a nitrogen atmosphere and the degree of cure ascertained in like manner. The maximum speed which provides only a slight mar is determined. The identities and amounts of the photopolymerization activators used and the maximum speeds at which the coatings would polymerize to the degree above specified are shown in Table 3.

Table 3

| Coating Composition | Photopolymerization Activator | | Maximum Curing Speed, m/min | |
|---|---|---|---|---|
| | Identity | Amount, Parts by Wt. | In Air | In N$_2$ |
| A | benzyl phenylglyoxylate | 1.2 | 12.2 | 15.2 |
| B | n-butyl phenylglyoxylate | 1.03 | 15.2 | 15.2 |
| C | ethyl phenylglyoxylate | 0.89 | 15.2 | 15.2 |
| D | benzophenone | 0.91 | 6.1 | 12.2 |
| E | ethyl o-chlorophenylglyoxylate | 1.1 | 12.2 | 12.2 |

EXAMPLE IX

A polyester is prepared in the conventional manner by reacting 10.6 molar parts propylene glycol, 5 molar parts phthalic anhydride and 5 molar parts maleic anhydride. A resin composition is prepared by thinning the polyester with styrene and the diacrylate of bisphenol A-diglycidyl ether.

Four coating compositions are each prepared by admixing 100 parts by weight resin composition and one part by weight photopolymerization activator. Each coating composition is drawn down on substrates and passed once, in air, at various speeds under the ultraviolet light emitting lamps of Example I, and the degree of polymerization is ascertained by the fingernail test. The maximum speed which provides little or no mar is determined. Relative polymerization rates are calculated by dividing the maximum speed of each coating composition by the greatest maximum speed of any coating composition. The identities of the photopolymerization activators and the relative polymerization tests are shown in Table 4.

Table 4

| Coating Composition | Photopolymerization Activator | Relative Polymerization Rate |
|---|---|---|
| A | Mixture of butyl isomers of butyl benzoin ether (Trigonal 14; Noury Chemical Corp.) | 1.00 |
| B | Ethyl phenylglyoxylate | 0.40 |
| C | Xanthone | 0.35 |
| D | α-Phenoxyacetophenone | 0.30 |

I claim:
1. An actinic light polymerizable composition comprising:
   a. at least one photopolymerization activator represented by the formula:

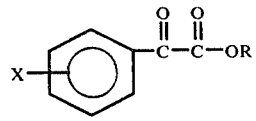

wherein
1. R is hydrogen, alkyl containing from one to about twenty-two carbon atoms, benzyl, phenyl, hydroxyalkyl containing from one to about ten carbon atoms, chloroalkyl containing from one to about ten carbon atoms, bromoalkyl containing from one to about ten carbon atoms, alkoxyalkyl where the alkoxy portion contains from one to about four carbon atoms and where the alkyl portion contains from one to about ten carbon atoms, or phenoxyalkyl where the alkyl portion contains from one to about ten carbon atoms; and
2. X is hydrogen, halo, alkoxy containing from one to about four carbon atoms or alkyl containing from one to about four carbon atoms; and
   b. organic polymerizable material containing a plurality of sites of ethylenic unsaturation and capable of being free radically addition polymerized by interaction with said photopolymerization activator upon exposure to actinic light, said organic polymerizable material comprising ethylenically unsaturated polyester containing a plurality of sites of ethylenic unsaturation, polymer having a plurality of sites of acrylic unsaturation, monomer having a plurality of sites of acrylic unsaturation or a mixture thereof.

2. The actinic light polymerizable composition of claim 1 wherein:
   a. said photopolymerization activator is present in an amount in the range of from about 0.01 percent to about 50 percent by weight of the binder of said composition; and
   b. said organic polymerizable material is present in an amount in the range of from about 20 to about 100 percent by weight of the binder of said composition.

3. The actinic light polymerizable composition of claim 2 wherein X is located in the ortho position.

4. The actinic light polymerizable composition of claim 2 wherein said photopolymerization activator is selected from the group consisting of methyl phenylglyoxylate, ethyl phenylglyoxylate, butyl phenylglyoxylate and butoxyethyl phenylglyoxylate.

5. The actinic light polymerizable composition of claim 2 containing at least one additional vinyl functional monomer.

6. The actinic light polymerizable composition of claim 5 wherein said vinyl functional monomer is present in the range of from about 1 to about 80 percent by weight of the binder of said composition.

7. The actinic light polymerizable composition of claim 2 wherein said organic polymerizable material comprises polymer having a plurality of sites of acrylic unsaturation, monomer having a plurality of sites of acrylic unsaturation or a mixture thereof.

8. A method comprising:
   a. coating a substrate with an actinic light curable composition comprising:
      1. at least one aromatic ketone photopolymerization activator represented by the formula:

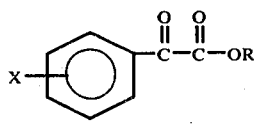

wherein
   R is hydrogen, alkyl containing from one to about twenty-two carbon atoms, benzyl, phenyl, hydroxyalkyl containing from one to about ten carbon atoms, chloroalkyl containing from one to about ten carbon atoms, bromoalkyl containing from one to about ten carbon atoms, alkoxyalkyl where the alkoxy portion contains from one to about four carbon atoms and where the alkyl portion contains from one to about ten carbon atoms, phenoxyalkyl where the alkyl portion contains from one to about ten carbon atoms, and
   X is hydrogen, halo, alkoxy containing from one to about four carbon atoms or alkyl containing from one to about four carbon atoms; and
   2. organic polymerizable material containing a plurality of sites of ethylenic unsaturation and capable of being free radically addition polymerized by interaction with said photopolymerization activator upon exposure to actinic light, said organic polymerizable material comprising ethylenically unsaturated polyester containing a plurality of sites of ethylenic unsaturation, polymer having a plurality of sites of acrylic unsaturation, monomer having a plurality of sites of acrylic unsaturation or a mixture thereof; and
   b. exposing said coated substrate to actinic light which is absorbable by said photopolymerization activator to produce free radicals capable of causing polymerization of sites of ethylenic unsaturation to thereby polymerize the coating into a hard, infusible film throughout its thickness.

9. The method of claim 8 wherein:
   a. said photopolymerization activator is present in an amount in the range of from about 0.001 percent to about 50 percent by weight of the binder of said composition; and
   b. said organic polymerizable material is present in an amount in the range of from about 20 to about 100 percent by weight of the binder of said composition.

10. The method of claim 9 wherein said exposure is conducted in an atmosphere containing a polymerization inhibiting concentration of oxygen.

11. The method of claim 9 wherein said exposure is conducted in air.

12. The method of claim 9 wherein said actinic light has a wavelength in the range of from about 185 to about 400 nanometers.

13. The method of claim 9 wherein X is located in the ortho position.

14. The method of claim 9 wherein said photopolymerization activator is selected from the group consisting of methyl phenylglyoxylate, ethyl phenylglyoxylate, butyl phenylglyoxylate and butoxyethyl phenylglyoxylate.

15. The method of claim 9 wherein said organic polymerizable material comprises polymer having a plurality of sites of acrylic unsaturation, monomer having a plurality of sites of acrylic unsaturation or a mixture thereof.

16. A method comprising:
   a. coating a substrate with an actinic light polymerizable composition comprising:
      1. a photopolymerization activator selected from the group consisting of methyl phenylglyoxylate, ethyl phenylglyoxlate, butyl phenylglyoxylate and butoxyethyl phenylglyoxylate, and
      2. organic polymerizable material containing a plurality of sites of ethylenic unsaturation and capable of being free radically addition polymerized by interaction with said photopolymerization activator upon exposure to actinic light, said organic polymerizable material comprises ethylenically unsaturated polyester containing a plurality of sites of ethylenic unsaturation; polymer having a plurality of sites of acrylic unsaturation, monomer having a plurality of sites of acrylic unsaturation or a mixture thereof; and
   b. exposing said coated substrate, in air, to actinic light, said actinic light
      1. having a wavelength in the range of from about 185 to about 400 nanometers, and
      2. being absorbable by said photopolymerization activator to produce free radicals capable of causing polymerization of sites of ethylenic unsaturation, to thereby polymerize said coating into a hard, infusible film throughout its thickness.

17. The method of claim 16 wherein
 a. said photopolymerization activator is present in an amount in the range of from about 0.01 percent to about 50 percent by weight of the binder of said composition; and
 b. said organic polymerizable material is present in an amount in the range of from about 20 to about 100 percent by weight of the binder of said composition.

18. The method of claim 17 wherein said organic polymerizable material comprises polymer having a plurality of sites of acrylic unsaturation, monomer having a plurality of sites of acrylic unsaturation or a mixture thereof.

19. A method comprising exposing to actinic light an actinic light polymerizable composition comprising:
 a. at least one photopolymerization activator represented by the formula:

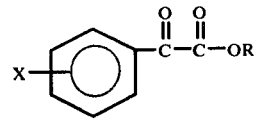

wherein
 1. R is hydrogen, alkyl containing from one to about twenty-two carbon atoms, benzyl, pheny, hydroxyalkyl containing from one to about ten carbon atoms, chloroalkyl containing from one to about ten carbon atoms, bromoalkyl containing from one to about ten carbon atoms, alkoxyalkyl where the alkoxy portion contains from one to about four carbon atoms and where the alkyl portion contains from one to about ten carbon atoms, or phenoxyalkyl where the alkyl portion contains from one to about ten carbon atoms; and
 2. X is hydrogen, halo, alkoxy containing from one to about four carbon atoms or alkyl containing from one to about four carbon atoms; and
 b. organic polymerizable material containing ethylenic unsaturation and capable of being free radically addition polymerized by interaction with said photopolymerization activator upon exposure to actinic light, to polymerize said organic polymerizable material.

* * * * *